Figure 1:
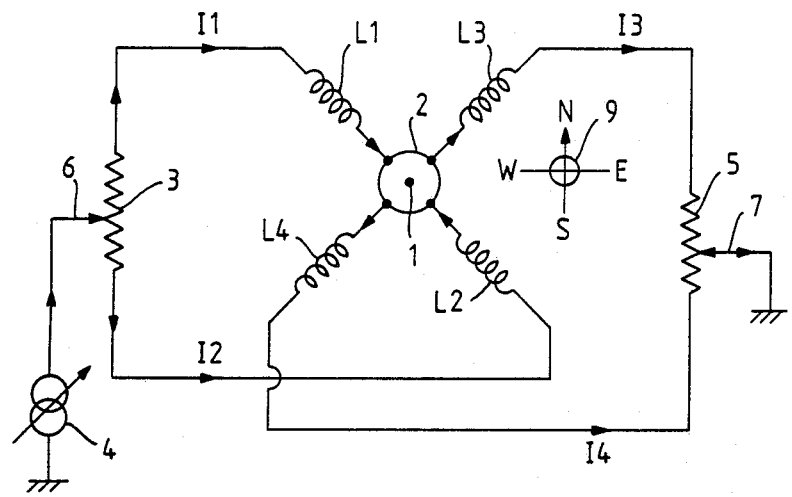

United States Patent [19]

Herbert

[11] Patent Number: 4,902,940
[45] Date of Patent: Feb. 20, 1990

[54] CURRENT CONTROL CIRCUIT

[75] Inventor: Brian K. Herbert, East Grinstead, England

[73] Assignee: U.S. Philips Corporation, New York, N.Y.

[21] Appl. No.: 279,387

[22] Filed: Dec. 2, 1988

[30] Foreign Application Priority Data

Dec. 4, 1987 [GB] United Kingdom ............... 8728441

[51] Int. Cl.[4] ..................... H01J 29/58; H01J 29/70
[52] U.S. Cl. .................................. 315/382; 315/387
[58] Field of Search ................. 315/387, 382, 399; 250/396 R, 396 ML, 311

[56] References Cited

FOREIGN PATENT DOCUMENTS 1305714 2/1973 United Kingdom .
2029179 3/1980 United Kingdom .
2074429 10/1981 United Kingdom .

Primary Examiner—Thomas H. Tarcza
Assistant Examiner—Gregory C. Issing
Attorney, Agent, or Firm—Robert J. Kraus

[57] ABSTRACT

A current control circuit is provided for a stigmator lens of an electron or ion beam machine. The stigmator lens consists of two magnetic quadrupole lenses, each of which has two pairs of coils. Current monitoring resistors R10,R11,R12 and R13 are connected in series with the individual coils L1,L2,L3 and L4 of the quadrupole and a resistor R3 is connected to monitor the sum of currents in the pairs of coils. Voltage signals from the resistors are used to close feedback loops which drive currents into the individual coils so that the sum of currents in a pair of coils is held constant at a value set by an adjustable astigmatism control and so that the ratio of the currents in a pair of coils is held constant at a value set by an adjustable beam centering control. Coil currents are stabilized in spite of coil resistance changes due to Joule heating by the currents. Computer control of astigmatism and centering is facilitated since only signal voltages are required as inputs to the circuit.

5 Claims, 2 Drawing Sheets

CURRENT CONTROL CIRCUIT

DESCRIPTION

This invention relates to current control circuits. In particular, it relates to a current control circuit for a magnetic quadrupole lens having two pairs of coils. Such quadrupole lenses may be used in pairs in machines producing focused electron or ion beams to correct the astigmatism of the beam. Such a pair of quadrupole lenses is referred to in the art as a stigmator lens. Such machines are electron lithographical writers, electron microscopes, or focused ion beam machines for direct writing implantation of dopants into semiconductors. The use of quadrupole or stigmator lenses in such machines for correcting astigmatism or for other electron-optical beam control purposes is well known in the art.

The four coils of a quadrupole lens are arranged with their coil axes in a plane normal to the electron or ion beam. The coil axes intersect at the nominal location of the beam. The coils of a pair are located on opposite sides of the beam with their axes colinear, the axes of the other pair being normal to the axes of the first pair. A clear space is provided at the intersection of the coil axes to accommodate a tubular vacuum vessel in which the beam is established.

In use, the coil current supply arrangements of the quadrupole lens are such that the magnetic fields produced by one pair of coils are in opposition at the beam and the fields produced by the other pair of coils are in reverse opposition at the beam. Assuming that the points of zero magnetic field for each pair of coils are coincident at the beam, the values and polarities of current in all four coils are then adjusted, keeping the four currents in proportion, to achieve the desired astigmatism control in two directions only at right angles to one another. The currents of the four coils of the other quadrupole lens of the stigmator are then similarly adjusted to achieve similar control in two directions only but at 45 degrees around the beam to the first two directions. By variation of the strengths and polarities of the two quadrupole currents, any degree and orientation of astigmatism can be corrected.

However, the assumption that the points of zero field for each pair of coil are coincident at the beam is rarely correct owing to mechanical and electrical tolerances elsewhere in the beam column. Deflection of the beam to achieve coincidence is rarely possible since it would disturb beam alignment with later items in the column. Mechanical displacement of the quadrupole in the plane normal to the beam is not desirable owing to problems with the precision of mechanism required. The better known solution is varying the relative strengths of the currents in the coils of a pair to shift the null field point towards one or other coil. Thereafter, care must be taken to preserve the ratio of the currents in the pair when the astigmatism adjustment is made, otherwise the null position will be disturbed. Care must also be taken to keep the sum of the currents in a pair of coils constant and equal to the sum of the currents in the other pair of coils when a centering adjustment is made, otherwise the astigmatism adjustment will be disturbed.

A known current control circuit for achieving independent astigmatism and null centering control connects one end of all four coils together and connects the other end of each pair of coils to either end of a respective potentiometer. A variable current generator is then connected to drive a current between the sliders of the two potentiometers to achieve astigmatism control. Adjustment of the position of a potentiometer slider adjusts the ratio of currents in the coils of a pair independently of the ratio of currents in the coils of the other pair, and so provides the null centering adjustment. The sum of currents in a pair is held constant and equal to the sum in the other pair since the generator maintains a constant current, once set, in spite of changes of overall circuit resistance which occur when a centering adjustment is made. Once a centering adjustment is made, the ratio of currents in a pair is fixed by the ratio of the resistances of the two parts of the potentiometer and their respective coils and so an astigmatism adjustment does not disturb the null centering adjustment.

Though the above current control circuit is simple, it has practical disadvantages. First, the currents in the coils are relatively large, typically 100 ma and hence there is joule heating of the potentiometers and of the coils. Circuit resistances will therefore change and disturb the centering adjustment. Also, the heating of the potentiometers may make them unreliable. The control of the centering currents is a non-linear function of the potentiometer rotations and this makes manual adjustment difficult. The power consumption of the circuit is higher than the minimum needed to energise the coils due to the voltage drop across the potentiometers. Finally, the circuit assumes that the centering operation at least is carried out by hand. In use, an electron beam pattern generator, for example, would be under computer control. The conversion of the digital signals of the computer into an equivalent shaft rotation of a potentiometer can be done but is somewhat impractical. Desirably, the current control circuit should be amenable to direct computer control.

It is an object of the invention to provide a current control circuit for a quadrupole lens in which the coil currents are independent of any change in coil resistance due to joule heating.

It is another object of the invention to provide a current control circuit for a quadrupole lens in which the coil currents are linear functions of input control voltages which, in turn, can be generated by a computer.

The invention provides a current control circuit for a magnetic quadrupole lens comprising two pairs of coils, characterised in that each coil is connected in series with a respective current monitoring resistor, in that the current monitoring resistors of the first pair of coils are connected together and to one end of a total current monitoring resistor and the current monitoring resistors of the second pair of coils are connected together and to the other end of the total current monitoring resistor to form a current distribution network, in that a first d.c. generator is connected to drive current through one coil and current monitoring resistor of the first pair of coils and thence into the current distribution network, one coil and current monitoring resistor of the second pair of coils forming a current return path, in that first means are provided for controlling the first d.c. generator so that the voltage across the total current monitoring resistor is equal to a predetermined proportion of an adjustable input astigmatism control voltage, in that a second d.c. generator is connected to drive current through the other coil and current monitoring resistor of the first pair of coils and thence into the current distribution network, in that second means are provided for controlling the second d.c. generator so that the difference in voltage across the current monitoring resistors of the first pair of coils is equal to a first adjustable proportion of the adjustable input astigmatism control voltage, in that a third d.c. generator is connected to drive current through the other coil and current monitoring resistor of the second pair of coils and thence into the current distribution network, and in that third means are provided for controlling the third d.c. generator so that the difference in voltage across the current monitoring resistors of the second pair of coils is a second adjustable proportion of the adjustable input control voltage. With this arrangement, the adjustable input control voltage controls the total current flowing in the quadrupole lens and hence forms the astigmatism control of the quadrupole. The first and second adjustable proportions of the adjustable input control voltage form the two centering controls. Since the current control circuit operates to maintain the difference in the currents of a pair of coils as an adjustable proportion of the astigmatism current, the ratio of the coil currents of a pair is held constant at the chosen adjustable proportion in spite of changes of the astigmatism current.

In a control circuit in accordance with the invention a coil current is now independent of coil resistance and its variation with temperature. The current is now measured and controlled at a value determined by the voltage it produces across a current monitoring resistor.

The current control circuit may be further characterised in that each d.c. generator has a voltage input terminal and a current output terminal at which an output current is provided in response to a voltage input, in that the first, second and third means each comprise a unity gain differential amplifier, in that each differential amplifier output terminal and the respective proportion of the adjustable input control voltage are connected, one each, to opposite ends of a respective pair of feedback resistors connected in series, the junction of the feedback resistors being connected to the voltage input terminal of the respective current generator, in that the input terminals of the first differential amplifier are connected across the total current monitoring resistor, and in that the input terminals of the second and third differential amplifiers are connected across the current monitoring resistors of the first and second pair of coils respectively. Typically, the d.c. generators may each be an integrated power operational amplifier having a high input impedance bipolar input and a high current bipolar output. Typically the unity gain differential amplifiers may be a monolithic circuit consisting of a high gain operational amplifier and an on-chip precision resistor network to produce the unity gain. The ratio of the two feedback resistors associated with the first d.c. generator determines the predetermined proportion of the adjustable input control voltage to which the voltage across the total current monitoring resistor is equalised, and hence determines, in cooperation with the specific value of the total current monitoring resistor, the scale factor relating the total current to the input voltage. In like manner, the values of the current monitoring resistors of each pair of coils, taken with the ratio of the feedback resistors associated therewith, determine the scale factor relating the current difference in a coil pair to the associated adjustable proportion of the adjustable input control voltage.

The current control circuit may be further characterised in that the adjustable input control voltage is obtained from the slider of a first potentiometer connected across a fixed d.c. supply voltage, and in that the first and second adjustable proportions of the adjustable input control voltage are obtained from the sliders of second and third potentiometers respectively connected to the slider of the first potentiometer. Such an arrangement provides a simple way of providing the first and second adjustable proportions of the adjustable input control voltage in the event that manual control of centering is to be carried out. The potentiometers do not carry the coil currents. They are low current signal potentiometers and the same voltages can now easily be provided by digital to analogue converters receiving digital voltage value from a computer control system which receives input from an astigmatism and centering measurement system and calculates the adjustments to be made.

Figure 2:
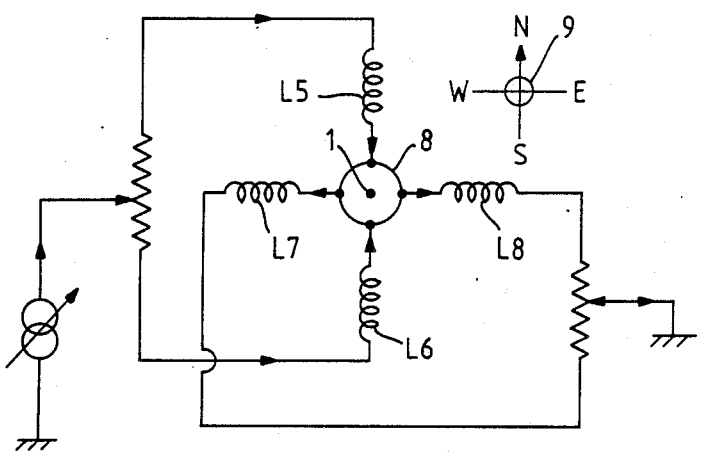
Figure 3:
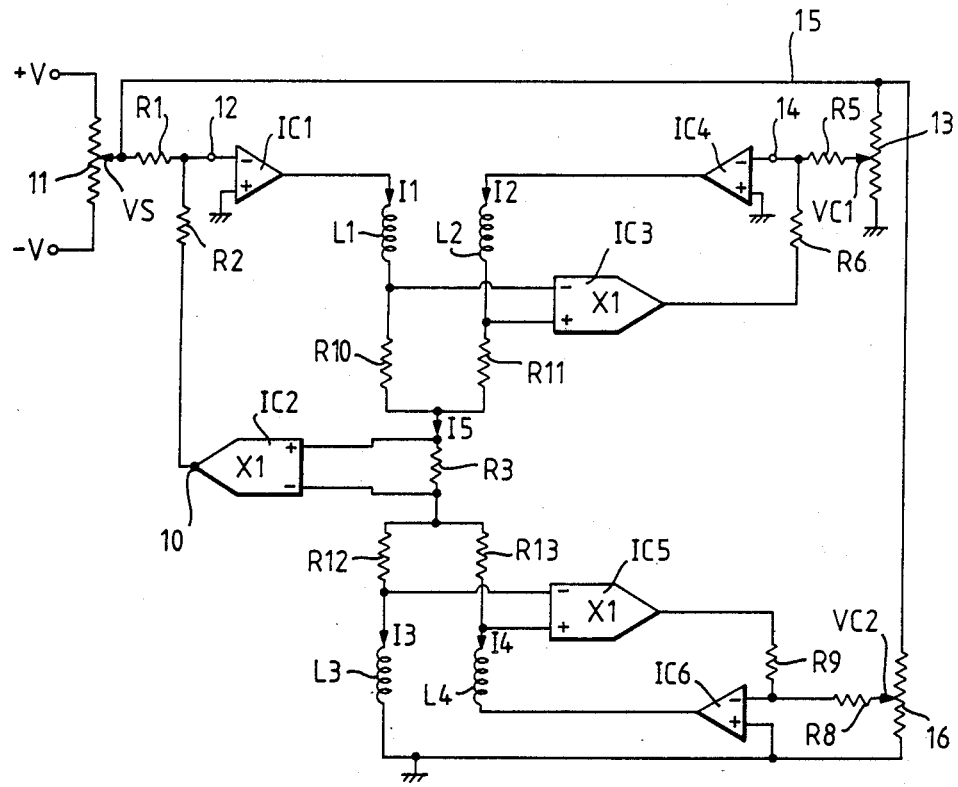

An embodiment of the invention will now be described, by way of example, with reference to the accompaying drawings in which FIGS. 1 and 2 together show a known circuit for current control in a stigmator lens, and FIG. 3 shows a current control circuit in accordance with the invention.

Referring to FIG. 1, the four coils L1, L2, L3 and L4 of a quadrupole are shown schematically lying with their axes in the plane of the drawing normal to the electron beam 1 shown in section. The axes of the first pair of coils L1,L2 are colinear and the coils are connected together at a node 2. The outer ends of coils L1 and L2 are connected to opposite ends of a potentiometer 3, the slider 6 of this potentiometer being connected to a variable current generator 4. The directions of currents I1 and I2 and the winding sense of the coils L1 and L2 are such that the magnetic fields produced by these coils are opposed, say inwardly, in the region of the beam 1. The axes of the second pair of coils L3,L4 are also colinear and the coils are connected together at node 2. The outer ends of coils L3 and L4 are connected to opposite ends of a potentiometer 5, the slider 7 of which is returned to the other side of current generator 4 via the earth connection. The directions of currents I3 and I4 and the winding sense of the coils L3 and L4 are such that the magnetic fields produced by these coils are opposed in the region of beam 1 but in the opposite sense, say outwardly, to the fields of coils L1 and L2. This arrangement produces the characteristic quadrupole magnetic field configuration at the beam 1. Thus, whatever the setting of the two potentiometers 3 and 5, the sum of the currents in L1 and L2 will always equal the sum of the currents in L3 and L4. Since generator 4 is a current source, the value of the current sums in the pairs of coils are controlled entirely by the setting of the generator 4 regardless of the total resistance of the circuit which can vary according to the setting of potentiometers 3 and 5.

For the sake of ease in the description of FIGS. 1 and 2, the coil and magnetic field directions are referred to the directions of the compass 9, though there is no necessary relationship between these directions and the geographic directions. Coils L1 and L2 produce opposed fields in the NW to SE direction and the position of the null in the magnetic field depends upon the ratio of the currents I1 and I2 which, in turn are determined by the ratio of the sum of the resistances of coil L1 and the upper part of potentiometer 3 to the sum of the resistances of coil L2 and the lower part of potentiometer 3. Thus, once a potentiometer setting has been made, the ratio of currents is fixed, assuming that the coil and potentiometer resistances do not change, owing to Joule heating by the currents I1 and I2 for example. In like manner, the position of the null in the magnetic field produced by coils L3 and L4 in the NE to SW direction is fixed by the setting of potentiometer 5. Thus, independently of the setting of the variable current generator 4, the potentiometers 3 and 5 can be used to centre the two magnetic field nulls on the beam 1, as is required for deflection free operation of a quadrupole lens.

The operation of the second quadrupole lens of FIG. 2 is similar to that of FIG. 1 with the exception that the opposed fields are in the N to S and the E to W directions. In a stigmator lens the four coils of FIG. 1 are coplanar with the four coils of FIG. 2. In a practical electron beam pattern generator, for example, the adjustments could be made manually as follows. Both quadrupoles are switched off and the beam scanned in a raster pattern on a target of known configuration. A visible picture is derived from the raster in the manner of a scanning electron microscope and the target detail and location are noted. The stigmator currents are then switched on which will usually deflect the visible picture. The four centering controls are then adjusted, one quadrupole pair of controls at a time, until the picture is restored to its original position. The astigmatism of the beam can then be corrected by alternately adjusting the variable current generators of the two quadrupoles until the sharpest picture is obtained.

The disadvantages of this simple stigmator control circuit have been described above in the preamble of this specification. FIG. 3 shows an embodiment of a current control circuit in accordance with the invention for a quadrupole lens of a stigmator which largely avoids these disadvantages.

The four coils L1,L2,L3,L4 have equal numbers of turns and equal resistances, for example 5 ohms. Each of the coils L1,L2,L3 and L4 are connected in series with their respective current monitoring resistors R10,R11,R12 and R13, for example precision 1 ohm wire wound resistors. Resistors R10 and R11 are connected together and to one end of total current monitoring resistor R3, for example a precision 1 ohm wire wound resistor. Resistors R12 and R13, for example also precision 1 ohm wire wound resistors, are connected together and to the other end of R3, the five resistors forming a current distribution network. Thus, the voltages across R10,R11,R12 and R13 are proportional to the currents flowing through the respective coils, the scale factor of these voltages in the example being 1 volt per ampere of current. The voltage across R3 is proportional to the sum of the currents in L1 and L2 or in L3 and L4, the example scale factor being, again, 1 volt per ampere.

A first d.c. current generator IC1 is connected to drive current through L1 and R10 and thence into the current distribution network where it adds to the total current in R3 R12 and L3 of the second pair of coils form a current return path for part of the current in the network. The d.c. voltages at either end of R3 are applied to a unity gain differential amplifier IC2. The effect of IC2 is to reject any common mode voltage at R3 and to provide an output voltage equal to the voltage across R3 which is proportional to the sum of currents in L1 and L2, or in L3 and L4. The output voltage of IC2 at terminal 10 is connected to one end of a resistor R2 connected in series with a resistor R1 to the slider of a potentiometer 11 fed from supply voltages $+V$ and $-V$. The slider of potentiometer 11 provides an adjustable input astigmatism control voltage VS which can be manually set between the limits $+V$ and $-V$. A predetermined proportion of VS, fixed by the relative values of R1 and R2, is compared with output voltage of IC2 and the difference is applied to a bipolar input 12 of the generator IC1. Thus a feedback loop is closed which, by virtue of the high gain of IC1, ensures that the voltage across R3 is a predetermined proportion of VS. Thus once the setting of VS has been selected, the voltage across R3 will be held constant in spite of changes in current in other limbs of the network, which changes will be described later. Thus the sum of currents in L1 and L2, and also in L3 and L4, is held constant, which is one of the requirements of a quadrupole current control circuit. In the example, V is 10 volts, R1 is 100K, R2 is 10K, IC1, IC4 and IC6 are power operational amplifiers Type PA01 (Trade Mark) of Apex Microtechnology Corp., and IC2, IC3 and IC5 are type INA105 amplifiers (Trade Mark) of Burr-Brown.

A second d.c. generator IC4 is connected to drive current through L2 and R11 in series and thence into the current distribution network where it adds to the total current in R3. A unity gain differential amplifier IC3 is connected to extract the difference in voltages across R10 and R11 and to apply the voltage difference to one end of a resistor R6 connected in series with a resistor R5 to the slider of a potentiometer 13 fed from the voltage VS. The slider of potentiometer 13 supplies a voltage VC1 which is a first adjustable proportion of the adjustable input astigmatism control voltage VS. A predetermined proportion of VC1, fixed by the relative values of R5 and R6, is compared with the output voltage of IC3 and the difference is applied to a bipolar input 14 of the generator IC4. Again, a feedback loop is closed which ensures that the voltage difference across R10 and R11 is equal to a first adjustable proportion of the adjustable input astigmatism control voltage VS. The setting of a potentiometer 13 is used as the first centering control of the quadrupole. However, as VS is changed for astigmatism control, VC1 is changed in proportion because of connection 15 from VS to potentiometer 13 and hence the difference in coil currents in L1 and L2 is changed in proportion. But the change in VS produces a proportional change in the total current in coils L1 and L2. Consequently the ratio of the currents in L1 and L2 is preserved, for a fixed setting of potentiometer 13, while the astigmatism control VS is altered.

It will be seen that the configuration of the circuit comprising L3,R12,L4,R13,IC5,IC6,R8,R9 and potentiometer 16 is identical to that of the circuit comprising L1,R10,L2,R11,IC3,IC4, R5,R6 and potentiometer 13. The description of the two circuits is identical except that the setting of potentiometer 16 provides the second centering control VC2 of the quadrupole. For the same reasons the ratio of the currents in L3 and L4 is preserved, for a fixed setting of potentiometer 16, while the astigmatism control VS is altered. The centering controls VC1 and VC2 are independent of one another. Once VC1 and VC2 are fixed, the different ratios of the currents in R10 and R11 and in R12 and R13 are preserved in spite of changes in the total current 15 occasioned by changes in the astigmatism control VS, which is the other requirement of a quadrupole current control circuit. In the example R5 and R8 are 100K and R6 and R9 are 10K.

It will be noted that in the FIG. 3 circuit the connection 15 between VS and the two centering potentiometers is essential if the ratio of currents in a pair of coils is to be preserved while the total current is altered for astigmatism control. In an electron beam pattern generator, for example, which is operated under computer control, successive estimates of the voltage VS would be calculated as a digital quantity by the computer and output to a digital to analogue converter which then provides the analogue version of VS for input to R1. For centering, the computer can also calculate first and second adjustable digital proportions, or fractions, of the digital value of VS and output these values to respective digital to analogue converters which then supply the centering voltages VC1 and VC2 for input to R5 and R8 respectively. Thus the essential proportional link between VS and VC1,VC2 can be provided in a controlling computer. Different situations can arise in an electron beam pattern generator, for example, in which respective different sets of values of VS, VC1 and VC2 are appropriate. With computer control these sets of values can be determined and stored as digital quantities for rapid resetting of the pattern generator for a repeated situation, thereby enhancing productivity.

For the control of a stigmator in an electron or ion beam machine, two such control circuits as described with reference to FIG. 3 would be used, one for each of the two quadrupoles of the stigmator.

From reading the present disclosure, other modifications will be apparent to persons skilled in the art. Such modifications may involve other features which are already known in the design, manufacture and use of machines producing focused electron or ion beams and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A current control circuit for a magnetic quadrupole lens comprising two pairs of coils, characterised in that each coil is connected in series with a respective current monitoring resistor, in that the current monitoring resistors of the first pair of coils are connected together and to one end of a total current monitoring resistor and the current monitoring resistors of the second pair of coils are connected together and to the other end of the total current monitoring resistor to form a current distribution network, in that a first d.c. generator is connected to drive current through one coil and current monitoring resistor of the first pair of coils and thence into the current distribution network, one coil and current monitoring resistor of the second pair of coils forming a current return path, in that first means are provided for controlling the first d.c. generator so that the voltage across the total current monitoring resistor is equal to a predetermined proportion of an adjustable input astigmatism control voltage, in that a second d.c. generator is connected to drive current through the other coil and current monitoring resistor of the first pair of coils and thence into the current distribution network, in that second means are provided for controlling the second d.c. generator so that the difference in voltage across the current monitoring resistors of the first pair of coils is equal to a first adjustable proportion of the adjustable input astigmatism control voltage, in that a third d.c. generator is connected to drive current through the other coil and current monitoring resistor of the second pair of coils and thence into the current distribution network, and in that third means are provided for controlling the third d.c. generator so that the difference in voltage across the current monitoring resistors of the second pair of coils is a second adjustable proportion of the adjustable input control voltage.

2. A current control circuit as claimed in claim 1 characterised in that each d.c. generator has a voltage input terminal and a current output terminal at which an output current is provided in response to a voltage input, in that the first, second and third means each comprise a unity gain differential amplifier, in that each differential amplifier output terminal and the respective proportion of the adjustable input control voltage are connected, one each, to opposite ends of a respective pair of feedback resistors connected in series, the junction of the feedback resistors being connected to the voltage input terminal of the respective current generator, in that the input terminals of the first differential amplifier are connected across the total current monitoring resistor, and in that the input terminals of the second and third differential amplifiers are connected across the current monitoring resistors of the first and second pair of coils respectively.

3. A current control circuit as claimed in claim 1 or claim 2 characterised in that the adjustable input control voltage is obtained from the slider of a first potentiometer connected across a fixed d.c. supply voltage, and in that the first and second adjustable proportions of the adjustable input control voltage are obtained from the sliders of second and third potentiometers respectively connected to the slider of the first potentiometer.

4. A stigmator lens assembly comprising two coplanar magnetic quadrupole lenses, the axes of the coils of one quadrupole lens being at 45 degrees to the axes of the corresponding coils of the other quadrupole lens, characterised in that each quadrupole lens is connected to a respective current control circuit as claimed in any one of claims 1, 2 or 3.

5. An electron beam pattern generator comprising a stigmator lens assembly as claimed in claim 4.

* * * * *